(12) United States Patent
Nishimura et al.

(10) Patent No.: US 6,403,288 B1
(45) Date of Patent: Jun. 11, 2002

(54) RESIST PATTERN FORMATION METHOD

(75) Inventors: Yukio Nishimura; Toshiyuki Kai; Eiichi Kobayashi; Takeo Shioya, all of Mie (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 09/520,345

(22) Filed: Mar. 7, 2000

(30) Foreign Application Priority Data

Mar. 8, 1999 (JP) ............................................ 11-059808

(51) Int. Cl.$^7$ ........................ G03F 7/039; G03F 7/213; G03F 7/32; G03C 5/56; G03C 1/73
(52) U.S. Cl. .................... 430/326; 430/270.1; 430/331; 430/914
(58) Field of Search .............................. 430/270.1, 326, 430/329, 331, 914

(56) References Cited

U.S. PATENT DOCUMENTS

| | | | |
|---|---|---|---|
| 5,679,495 A | | 10/1997 | Yamachika et al. |
| 5,693,452 A | * | 12/1997 | Aoai et al. ................ 430/270.1 |
| 5,852,128 A | * | 12/1998 | Padmanaban et al. ... 525/328.8 |
| 5,891,603 A | * | 4/1999 | Kodama et al. .......... 430/270.1 |
| 5,962,187 A | * | 10/1999 | Takeda .................... 430/270.1 |
| 6,136,500 A | * | 10/2000 | Kobayashi et al. ....... 430/270.1 |

FOREIGN PATENT DOCUMENTS

| | | |
|---|---|---|
| DE | 44 10 441 | 9/1994 |
| EP | 0 443 820 | 8/1991 |
| JP | 7-209868 | 8/1995 |

OTHER PUBLICATIONS

Derwent Publications, AN 1994–022990, JP 05 331289, Dec. 14, 1993.
Derwent Publications, AN 1989–051432, JP 64 002050, Jan. 6, 1989.

* cited by examiner

*Primary Examiner*—Janet Baxter
*Assistant Examiner*—Sin J. Lee
(74) *Attorney, Agent, or Firm*—Oblon, Spivak, McClelland, Maier & Neustadt, P.C.

(57) ABSTRACT

A method of forming a resist pattern from a chemically amplified positive radiation sensitive resin composition.

The film thickness of an unexposed portion of a resist film formed from the chemically amplified positive radiation sensitive resin composition after wet development is 100 to 400 Å smaller than that before wet development. Alternatively, a resist film formed from the chemically amplified positive radiation sensitive resin composition is wet developed at both a temperature and a time enough to ensure that the film thickness of an unexposed portion of the resist film after wet development is 100 to 400 Å smaller than that before wet development.

A resist film which is formed from a chemically amplified positive radiation sensitive resin composition and experiences a 100 to 400 Å reduction in the film thickness of an unexposed portion by wet development is useful as a resist film for forming a resist pattern.

17 Claims, No Drawings

RESIST PATTERN FORMATION METHOD

DETAILED DESCRIPTION OF THE INVENTION

The present invention relates to a resist pattern formation method. More specifically, it relates to a method of forming a resist pattern free from a development defect by maintaining the amount of reduction in film thickness after wet development at a relatively large value.

There is proposed a chemically amplified resist whose sensitivity is improved by the catalytic function of a radiation sensitive acid generating agent which generates an acid when exposed to radiation (to be referred to as "exposure" hereinafter) as a resist suitable for use with far ultraviolet radiation from a KrF excimer laser or the like, charged beams such as electron beams and X-ray radiation such as synchrotron radiation.

As a problem special to this chemically amplified resist, it has been pointed out that its resist pattern is changed in line width or T-shaped according to a post-exposure delay (to be referred to as "PED" hereinafter) which is a time from exposure to a heat treatment. In recent years, there have been proposed various chemically amplified resists which can be applied in the production of devices, including a chemically amplified radiation sensitive resin composition which comprises a polymer consisting of a hydroxystyrene-based recurring unit, a t-butyl (meth)acrylate recurring unit and a recurring unit for reducing the solubility in an aqueous-alkaline developer of the polymer after exposure (JP-A 7-209868) (the term "JP-A" as used herein means an "unexamined published Japanese patent application").

Along with a reduction in the design rule of a device to a level of sub-half micron or less, attention has been paid to a new problem for the chemically amplified resist that development defects such as an undeveloped portion of a fine pattern, a fallen pattern and changes in line width (to be referred to as "development defects" hereinafter) are produced by "differences" in solubility in a developer among exposed portions. Since development defects greatly reduce device yield, needs for a chemically amplified positive radiation sensitive resin composition free from such development defects have been arising.

It is an object of the present invention to provide a resist pattern formation method.

It is another object of the present invention to provide a method of forming a resist pattern which is not changed in line width or T-shaped by PED, is free from development defects and does not impair basic performance (resolution, DOF) from a chemically amplified positive radiation sensitive resin composition.

It is still another object of the present invention to provide a method of forming a resist pattern from a chemically amplified positive radiation sensitive resin composition which has high sensitivity to various types of radiation including far ultraviolet radiation from a KrF excimer laser or the like, charged beams such as electron beams and X-ray radiation such as synchrotron radiation (small amount of exposure energy).

Other objects and advantages of the present invention will become apparent from the following description.

According to the present invention, firstly, the above objects and advantages of the present invention are attained by a method of forming a resist pattern from a chemically amplified positive radiation sensitive resin composition, wherein the film thickness of an unexposed portion of a resist film formed from the chemically amplified positive radiation sensitive resin composition after wet development is 100 to 400 Å smaller than that before wet development.

Secondly, the above objects and advantages of the present invention are attained by a method of forming a resist pattern from a chemically amplified positive radiation sensitive resin composition, wherein a resist film formed from the chemically amplified positive radiation sensitive resin composition is wet developed at both a temperature and a time enough to ensure that the thickness of an unexposed portion of the resist film after wet development is 100 to 4 Å smaller than that before wet development.

Thirdly, the above objects and advantages of the present invention are attained by use of a resist film which is formed from a chemically amplified positive radiation sensitive resin composition and whose thickness of an unexposed portion after wet development is 100 to 400 Å smaller than that before wet development as a resist film for forming a resist pattern.

The present invention will be described in detail hereinunder.

The chemically amplified positive radiation sensitive resin composition used in the present invention is preferably a composition comprising (A) a resin which contains an acid dissociable group and whose solubility in an aqueous-alkaline developer increases along with the dissociation of the acid dissociable group with an acid, and (B) a radiation sensitive acid generating agent which reacts to various types of radiation including far ultraviolet radiation from a KrF excimer laser or the like, charged beams such as electron beams, and X-ray radiation such as synchrotron radiation and generates an acid upon exposure.

(A) Resin

The resin (A) in the present invention which is insoluble or hardly soluble in an aqueous-alkaline developer is a resin which contains one or more acid dissociable groups and whose solubility in an aqueous-alkaline developer increases along with the dissociation of the acid dissociable group with an acid (to be referred to as "acid dissociable group-containing resin (A)" hereinafter).

The acid dissociable group-containing resin (A) is a resin which is insoluble or hardly soluble in an aqueous-alkaline developer itself and has such a structure that the hydrogen atom of an acidic functional group in an aqueous-alkaline developer soluble resin having at least one acidic functional group such as a phenolic hydroxyl group or carboxyl group, for example, an aqueous-alkaline developer soluble resin having at least one recurring unit selected from the group consisting of recurring units represented by the following formulas (1) to (4) is substituted by at least one -acid dissociable group which can be dissociated in the presence of an acid.

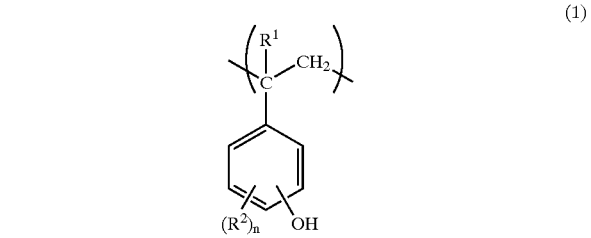

(1)

In the formula (1), $R^1$ is a hydrogen atom or methyl group, $R^2$ is a halogen atom or monovalent organic group having 1 to 6 carbon atoms, and n is an integer of 0 to 3.

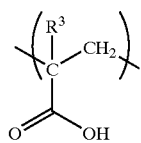

(2)

In the formula (2), $R^3$ is a hydrogen atom or methyl group.

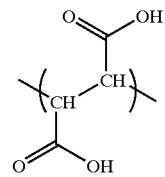

(3)

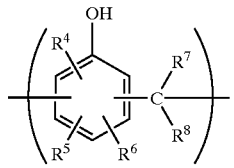

(4)

In the formula (4), $R^4$ to $R^8$ are each independently a hydrogen atom or linear or branched alkyl group having 1 to 4 carbon atoms.

The acid dissociable group in the acid dissociable group-containing resin (A) is a substituted methyl group, 1-substituted ethyl group, 1-substituted propyl group, 1-branched alkyl group, silyl group, germyl group, alkoxycarbonyl group, acyl group and cyclic acid dissociable group.

Examples of the substituted methyl group include methoxymethyl group, methylthiomethyl group, ethoxymethyl group, ethylthiomethyl group, methoxyethoxymethyl group, benzyloxymethyl group, benzylthiomethyl group, phenacyl group, bromophenacyl group, methoxyphenacyl group, methylthiophenacyl group, α-methylphenacyl group, cyclopropylmethyl group, benzyl group, diphenylmethyl group, triphenylmethyl group, bromobenzyl group, nitrobenzyl group, methoxybenzyl group, methylthiobenzyl group, ethoxybenzyl group, ethylthiobenzyl group, piperonyl group, methoxycarbonylmethyl group, ethoxycarbonylmethyl group, n-propoxycarbonylmethyl group, isopropoxycarbonylmethyl group, n-butoxycarbonylmethyl group, t-butoxycarbonylmethyl group and the like.

Examples of the 1-substituted ethyl group include 1-methoxyethyl group, 1-methylthioethyl group, 1,1-dimethoxyethyl group, 1-ethoxyethyl group, 1-ethylthioethyl group, 1-cyclohexyloxyethyl group, 1,1-diethoxyethyl group, 1-phenoxyethyl group, 1-phenylthioethyl group, 1,1-diphenoxyethyl group, 1-benzyloxyethyl group, 1-benzylthioethyl group, 1-cyclopropylethyl group, 1-phenylethyl group, 1,1-diphenylethyl group, 1-methoxycarbonylethyl group, 1-ethoxycarbonylethyl group, 1-n-propoxycarbonylethyl group, 1-isopropoxycarbonylethyl group, 1-n-butoxycarbonylethyl group, 1-t-butoxycarbonylethyl group and the like.

Examples of the 1-branched alkyl group include i-propyl group, sec-butyl group, t-butyl group, 1,1-dimethylpropyl group, 1-methylbutyl group, 1,1-dimethylbutyl group and the like.

Examples of the 1-substituted propyl group include 1-methoxypropyl group, 1-ethoxypropyl group and the like.

Examples of the silyl group include trimethylsilyl group, ethyldimethylsilyl group, methyldiethylsilyl group, triethylsilyl group, i-propyldimethylsilyl group, methyl-di-i-propylsilyl group, tri-i-propylsilyl group, t-butyldimethylsilyl group, methyl-di-t-butylsilyl group, tri-t-butylsilyl group, phenyldimethylsilyl group, methyldiphenylsilyl group, triphenylsilyl group and the like.

Examples of the germyl group include trimethylgermyl group, ethyldimethylgermyl group, methyldiethylgermyl group, triethylgermyl group, i-propyldimethylgermyl group, methyl-di-i-propylgermyl group, tri-i-propylgermyl group, t-butyldimethylgermyl group, methyl-di-t-butylgermyl group, tri-t-butylgermyl group, phenyldimethylgermyl group, methyldiphenylgermyl group, triphenylgermyl group and the like.

Examples of the alkoxycarbonyl group include methoxycarbonyl group, ethoxycarbonyl group, i-propoxycarbonyl group, t-butoxycarbonyl group and the like.

Examples of the acyl group include acetyl group, propionyl group, butyryl group, heptanoyl group, hexanoyl group, valeryl group, pivaloyl group, isovaleryl group, lauryloyl group, myristoyl group, palmitoyl group, stearoyl group, oxalyl group, malonyl group, succinyl group, glutaryl group, adipoyl group, piperoyl group, suberoyl group, azelaoyl group, sebacoyl group, acryloyl group, propioloyl group, methacryloyl group, crotonoyl group, oleoyl group, maleoyl group, fumaroyl group, mesaconoyl group, camphoroyl group, benzoyl group, phthaloyl group, isophthaloyl group, terephthaloyl group, naphthoyl group, toluoyl group, hydroatropoylgroup, atropoylgroup, cinnamoylgroup, furoyl group, thenoyl group, nicotinoyl group, isonicotinoyl group, p-toluenesulfonyl group, mesyl group and the like.

Examples of the cyclic acid dissociable group include cyclopropyl group, cyclopentyl group, cyclohexyl group, cyclohexenyl group, 4-methoxycyclohexyl group, tetrahydropyranyl group, tetrahydrofuranyl group, tetrahydrothiopyranyl group, tetrahydrothiofuranyl group, 3-bromotetrahydropyranyl group, 4-methoxytetrahydropyranyl group, 4-methoxytetrahydrothiopyranyl group, 3-tetrahydrothiophene-1,1-dioxide group and the like.

Out of these acid dissociable groups, t-butyl group, 1-methoxymethyl group, 1-methoxyethyl group, 1-ethoxyethyl group, 1-cyclohexyloxyethyl group, 1-ethoxypropyl group, 1-propoxyethyl group, trimethylsilyl group, t-butoxycarbonyl group, t-butoxycarbonylmethyl group, tetrahydropyranyl group and tetrahydrofuranyl group are preferred.

The acid dissociable group-containing resin (A) may contain at least one monomer (to be referred to as "other monomer" hereinafter) other than monomers having an acidic functional group and monomers having an acid dissociable group. The other monomer is a monofunctional monomer having one polymerizable unsaturated group in the molecule or a polyfunctional monomer having at least two polymerizable unsaturated groups in the molecule.

Illustrative examples of the monofunctional monomer having one polymerizable unsaturated group in the molecule (to be referred to as "monofunctional monomer" hereinafter) include styrenes such as styrene, α-methyl styrene and p-methoxystyrene; unsaturated carboxylic acids and carboxylic anhydrides such as (meth)acrylic acid, maleic acid, fumaric acid, crotonic acid, mesaconic acid, citraconic acid, itaconic acid, maleic anhydride and methyl maleic anhydride; esters such as methyl esters, ethyl esters, n-propyl esters, i-propyl esters, n-butyl esters, i-butyl esters, sec-butyl esters, t-butyl esters, n-amyl esters, 2-hydroxyethyl esters, 2,2-dimethyl-3-hydroxypropyl esters, benzyl esters, isobornyl esters, adamantyl esters, tricyclodecanyl esters and tetracyclodecanyl esters of the above unsaturated carboxylic acids; unsaturated nitrites such as (meth) acrylonitrile, maleinnitrile, fumaronitrile, mesaconnitrile, citraconnitrile and itaconnitrile; unsaturated amides such as (meth)acrylamide, crotonamide, maleinamide, fumaramide, mesaconamide, citraconamide and itaconamide; unsaturated imides such as maleimide and N-phenylmaleimide; unsaturated alcohols such as (meth)allyl alcohol; vinylanilines, vinylpyridines, N-vinyl-ε-caprolactam, N-vinylpyrrolidone, N-vinylimidazole, N-vinylcarbazole and the like. These monofunctional monomers may be used alone or in admixture of two or more.

Out of the above monofunctional monomers, styrene, p-methoxystyrene, isobornyl (meth)acrylate, adamantyl (meth)acrylate, tricyclodecanyl (meth)acrylate and (meth) acrylonitrile are preferred.

The content of the recurring unit of the monofunctional monomer is preferably 20 mol % or less, more preferably 15 mol % or less based on the total of all the recurring units in the acid dissociable group-containing resin (A).

The polyfunctional monomer having at least two polymerizable unsaturated groups in the molecule (to be referred to as "polyfunctional monomer" hereinafter) out of the other monomers is, for example, an ester of a compound having at least two hydroxyl groups in the molecule such as a polyhydric alcohol having a valence of 2 or more, polyether diol or polyester diol and (meth)acrylic acid; adduct of a compound having at least two epoxy groups in the molecule typified by an epoxy resin and (meth)acrylic acid; or condensate of a compound having at least two amino groups in the molecule and (meth)acrylic acid. Illustrative examples of the polyfunctional monomer include ethylene glycol di(meth)acrylate, diethylene glycol di(meth)acrylate, triethylene glycol di(meth)acrylate, propylene glycol di(meth) acrylate, dipropylene glycol di(meth)acrylate, tripropylene glycol di(meth)acrylate, 1,4-butanediol di(meth)acrylate, trimethylolpropane di(meth)acrylate, trimethylolpropane tri (meth)acrylate, pentaerythritol tri(meth)acrylate, pentaerythritol tetra(meth)acrylate, tricyclodecanedimethanol di(meth)acrylate, 2,5-dimethyl-2,5-hexanediol di(meth) acrylate, N,N'-methylenebis(meth)acrylamide, di(meth) acrylates of alkylene glycol (derivatives) such as an an adduct of bisphenol A with ethylene glycol and bisphenol A adduct with propylene glycol, diepoxy(meth)acrylates such as an adduct of a bisphenol A diglycidyl ether with a couple of (meth)acrylic acid, and the like.

Out of these polyfunctional monomers, ethylene glycol di(meth)acrylate, tricyclodecanedimethanol di(meth) acrylate, 2,5-dimethyl-2,5-hexanediol di(meth)acrylate and an adduct of a bisphenol A diglycidyl ether with di(meth) acrylic acid are particularly preferred.

When a polyfunctional monomer is used as the other monomer which gives other recurring unit, an appropriate crosslinking structure is introduced into the acid dissociable group-containing resin (A) to reduce the movability of a polymer molecular chain, thereby making it possible to suppress thermal deformation to improve heat resistance and the like. When the crosslinking structure introduced by the polyfunctional monomer has acid dissociability, a reduction in molecular weight caused by exposure becomes larger than in the case of a straight-chain resin or when the crosslinking structure has no acid dissociability, whereby a difference in the speed of dissolution in a developer between an exposed portion and an unexposed portion increases, thereby making it possible to further improve resolution.

The content of the polymerization unit of the polyfunctional monomer is preferably 10 mol % or less, more preferably 5 mol % or less based on the total of all the recurring units contained in the acid dissociable group-containing resin (A).

The protecting ratio of the acid dissociable group (ratio of the number of moles of the acid dissociable group to the total number of moles of the acidic functional group and the acid dissociable group in the acid dissociable group-containing resin (A)) cannot be generally specified according to the type of acid dissociable group and the type of aqueous-alkalie soluble resin into which the acid dissociable group is introduced but preferably 10 to 100 mol %, more preferably 15 to 90 mol %. When the protecting ratio of the acid dissociable group into the acid dissociable group-containing resin (A) is lower than 15 mol %, the sensitivity of a resist tends to lower and when the protecting ratio is higher than 90 mol %, the resolution of a resist tends to lower.

The acid dissociable group-containing resin (A) can be produced by the following methods (a) to (e).

(a) A monomer having an acidic functional group and a monomer having an acid dissociable group are polymerized together with a monomer corresponding to the other recurring unit as the case may be in the presence of a suitably selected radical polymerization initiator by an appropriate method such as bulk polymerization, solution polymerization, precipitation polymerization, emulsion polymerization, suspension polymerization or bulk-suspension polymerization, or cation polymerization.

(b) A 4-t-butoxystyrene is polymerized together with a monomer corresponding to the other recurring unit as the case may be in the presence of a suitably selected radical polymerization initiator by an appropriate method such as bulkpolymerization, solutionpolymerization, precipitation polymerization, emulsion polymerization, suspension polymerization or bulk-suspension polymerization, or living anion polymerized, a t-butyl group contained in the obtained copolymer is selectively hydrolyzed and/or solvolyzed in the presence of an acidic catalyst to form an acidic functional group, and the hydrogen atom of the acidic functional group is substituted by an acid dissociable group such as a 1-substituted ethyl group or alkoxycarbonyl group.

(c) An 4-acetoxystyrene and a monomer having an acid dissociable group are polymerized together with a monomer corresponding to the other recurring unit as the case may be in the presence of a suitably selected radical polymerization initiator by an appropriate method such as bulk polymerization, solution polymerization, precipitation polymerization, emulsion polymerization, suspension polymerization or bulk-suspension polymerization, an acetyl Group contained in the obtained copolymer is selectively hydrolyzed and/or solvolyzed in the presence of a basic catalyst to form an acidic functional group, and the hydrogen atom of the acidic functional group is substituted by an acid dissociable group such as an 1-substituted ethyl group or alkoxycarbonyl group.

(d) A monomer having an acid dissociable group such as 4-t-butoxystyrenes is polymerized together with a monomer corresponding to the other recurring unit as the case may be in the presence of a suitably selected radical polymerization initiator by an appropriate method such as bulk polymerization, solution polymerization, precipitation polymerization, emulsion polymerization, suspension polymerization or bulk-suspension polymerization, or living anion polymerized, and a t-butyl group contained in the obtained copolymer is selectively hydrolyzed and/or solvolyzed in the presence of an acidic catalyst.

(e) An 4-acetoxystyrene is polymerized together with a monomer corresponding to the other recurring unit as the case may be in the presence of a suitably selected radical polymerization initiator by an appropriate method such as bulk polymerization, solution polymerization, precipitation polymerization, emulsion polymerization, suspension polymerization or bulk-suspension polymerization, and an acetyl group contained in the obtained copolymer is selectively hydrolyzed and/or solvolyzed in the presence of a basic catalyst.

The weight average molecular weight in terms of polystyrene (to be referred to as "Mw" hereinafter) measured by gel permeation chromatography (GPC) of the acid dissociable group-containing resin (A) is as follows. Mw of the acid dissociable group-containing resin (A) having no crosslinking structure introduced by a polyfunctional monomer is preferably 1,000 to 100,000, more preferably 3,000 to 40,000, more preferably 3,000 to 30,000. When Mw of the acid dissociable group-containing resin (A) is less than 1,000, the sensitivity and heat resistance of a resist tend to lower and when Mw is more than 100,000, solubility in a developer tends to lower.

The ratio (Mw/Mn) of Mw to the number average molecular weight in terms of polystyrene (to be referred to as "Mn" hereinafter) measured by gel permeation chromatography (GPC) of the acid dissociable group-containing resin having no crosslinking structure introduced by a polyfunctional monomer is generally 1.0 to 5.0, preferably 1.0 to 4.0, more preferably 1.0 to 3.0.

Mw of the acid dissociable group-containing resin (A) having a crosslinking structure introduced by a polyfunctional monomer is preferably 3,000 to 500,000, more preferably 5,000 to 400,000, much more preferably 8,000 to 300,000. When Mw of the acid dissociable group-containing resin (A) is less than 3,000, the sensitivity and heat resistance of a resist are apt to lower and when Mw is more than 500,000, the developability of a resist is apt to lower, thereby promoting the production of a development defect.

Mw/Mn of the acid dissociable group-containing resin (A) having a crosslinking structure introduced by a polyfunctional monomer is generally 1.5 to 20.0, preferably 1.5 to 15.0.

(B) Radiation Sensitive Acid Generating Agent

The radiation sensitive acid generating agent (B) (to be referred to as "acid generating agent" hereinafter) used in the present invention is a compound which generates an acid when exposed to radiation.

The acid generating agent is an (1) onium salt, (2) sulfone compound, (3) sulfonate compound, (4) sulfoneimide compound, (5) diazomethane compound or (6) disulfonylmethane compound.

Illustrative examples of the acid generating agent are given below.

(1) Onium Salt such as an Iodonium Salt, Sulfonium Salt, Phosphonium Salt, Diazonium Salt, Ammonium Salt or Pyridinium Salt.

Illustrative examples of the onium salt compound include bis(4-t-butylphenyl)iodonium nonafluorobutanesulfonate, bis(4-t-butylphenyl)iodonium trifluoromethanesulfonate, bis(4-t-butylphenyl)iodonium pyrenesulfonate, bis(4-t-butylphenyl)iodonium dodecylbenzenesulfonate, bis(4-t-butylphenyl)iodonium p-toluenesulfonate, bis(4-t-butylphenyl)iodonium benzenesulfonate, bis(4-t-butylphenyl)iodonium 10-camphorsulfonate, bis(4-t-butylphenyl)iodonium octanesulfonate, bis(4-t-butylphenyl) iodonium 2-trifluoromethylbenzenesulfonate, diphenyl iodonium nonafluorobutanesulfonate, diphenyl iodonium trifluoromethanesulfonate, diphenyl iodonium pyrenesulfonate, diphenyl iodonium dodecylbezenesulfonate, diphenyl iodonium p-toluenesulfonate, diphenyl iodonium benzenesulfonate, diphenyl iodonium 10-camphorsulfonate, diphenyl iodonium octanesulfonate, diphenyl iodonium 2-trifluoromethylbenzenesulfonate, triphenylsulfonium nonafluorobutanesulfonate, triphenylsulfonium trifluoromethanesulfonate, triphenylsulfonium pyrenesulfonate, triphenylsulfonium dodecylbenzenesulfonate, triphenylsulfonium p-toluenesulfonate, triphenylsulfonium benzenesulfonate, triphenylsulfonium 10-camphorsulfonate, triphenylsulfonium octanesulfonate, triphenylsulfonium 2-trifluoromethylbenzenesulfonate, triphenylsulfonium hexafluoroantimonate, triphenylsulfonium naphthalenesulfonate, 4-t-butylphenyl-diphenylsulfonium nonafluorobutanesulfonate, 4-t-butylphenyl·diphenylsulfonium trifluoromethanesulfonate, 4-t-butylphenyl·diphenylsulfonium pyrenesulfonate, 4-t-butylphenyl·diphenylsulfonium dodecylbenzenesulfonate, 4-t-butylphenyl·diphenylsulfonium p-toluenesulfonate, 4-t-butylphenyl·diphenylsulfonium benzenesulfonate, 4-t-butylphenyl·diphenylsulfonium 10-camphorsulfonate, 4-t-butylphenyl·diphenylsulfonium octanesulfonate, 4-t-butylphenyl·diphenylsulfonium 2-trifluoromethylbenzenesulfonate, 4-t-butoxyphenyl·diphenylsulfonium trifluoromethanesulfonate, 4-t-butoxyphenyl·diphenylsulfonium nonafluorobutanesulfonate, 4-t-butoxyphenyl·diphenylsulfonium p-toluenesulfonate, 4-t-butoxyphenyl·diphenylsulfonium benzenesulfonate, 4-t-butoxyphenyl·diphenylsulfonium 10-camphorsulfonate, 4-t-butoxyphenyl·diphenylsulfonium octanesulfonate, 4-t-butoxyphenyl·diphenylsulfonium 2-trifluoromethylbenzenesulfonate, 4-hydroxyphenyl·diphenylsulfonium trifluoromethanesulfonate, 4-hydroxyphenyl·diphenylsulfonium nonafluorobutanesulfonate, 4-hydroxyphenyl·diphenylsulfonium p-toluenesulfonate, 4-hydroxyphenyl·diphenylsulfonium benzenesulfonate, 4-hydroxyphenyl·diphenylsulfonium 10-camphorsulfonate, 4-hydroxyphenyl·diphenylsulfonium octanesulfonate, 4-hydroxyphenyl·diphenylsulfonium 2-trifluoromethylbenzenesulfonate and the like.

(2) Sulfone Compound Such as a β-ketosulfone, β-sulfonylsulfone or α-diazo Compound Thereof.

Illustrative examples of the sulfone compound include phenacylphenylsulfone, mesitylphenacylsulfone, bis(phenylsulfonyl)methane and 4-trisphenacylsulfone.

(3) Sulfonate Compound Such as an Alkyl Sulfonate, Haloalkyl Sulfonate, Aryl Sulfonate or Iminosulfonate.

Illustrative examples of the sulfonate compound include benzoin tosylate, pyrogallol tristrifluoromethane sulfonate, pyrogallol trisnonafluorobutane sulfonate, pyrogallol methane trisulfonate, nitrobenzyl-9,10-diethoxyanthracene-2-sulfonate, α-methylolbenzoin tosylate, α-methylolbenzoin octanesulfonate, α-methylolbenzoin trifluoromethane sulfonate, α-methylolbenzoin dodecylsulfonate and the like.

(4) Sulfonimide Compound Represented by the Following Formula (5):

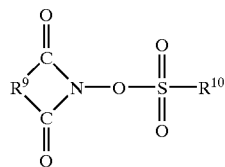

(5)

wherein $R^9$ is a divalent group such as an alkylene group, arylene group or alkoxylene group, and $R^{10}$ is a monovalent group such as an alkyl group, aryl group, halogen-substituted alkyl group or halogen-substituted aryl group.

Illustrative examples of the sulfonimide compound include N-(trifluoromethylsulfonyloxy)succinimide, N-(trifluoromethylsulfonyloxy)phthalimide, N-(trifluoromethylsulfonyloxy)diphenyl maleimide, N-(trifluoromethylsulfonyloxy)bicyclo[2.2.1]hept-5-ene-2,3-dicarboxyimide, N-(trifluoromethylsulfonyloxy)-7-oxabicyclo[2.2.1]hept-5-ene-2,3-dicarboxyimide, N-(trifluoromethylsulfonyloxy)bicyclo[2.2.1]heptan-5,6-oxy-2,3-dicarboxyimide, N-(trifluoromethylsulfonyloxy) naphthylimide, N-(10-camphorsulfonyloxy)succinimide, N-(10-camphorsulfonyloxy)phthalimide, N-(10-camphorsulfonyloxy)diphenyl maleimide, N-(10-camphorsulfonyloxy)bicyclo[2.2.1]hept-5-ene-2,3-dicarboxyimide, N-(10-camphorsulfonyloxy)-7-oxabicyclo[2.2.1]hept-5-ene-2,3-dicarboxyimide, N-(10-camphorsulfonyloxy)bicyclo[2.2.1]heptan-5,6-oxy-2,3-dicarboxyimide, N-(10-camphorsulfonyloxy)naphthylimide, N-(p-toluenesulfonyloxy)succinimide, N-(p-toluenesulfonyloxy)phthalimide, N-(p-toluenesulfonyloxy)diphenyl maleimide, N-(p-toluenesulfonyloxy)bicyclo[2.2.1]hept-5-ene-2,3-dicarboxyimide, N-(p-toluenesulfonyloxy)-7-oxabicyclo[2.2.1]hept-5-ene-2,3-dicarboxyimide, N-(p-toluenesulfonyloxy)bicyclo[2.2.1]heptan-5,6-oxy-2,3-dicarboxyimide, N-(p-toluenesulfonyloxy)naphthylimide, N-(2-trifluoromethylbenzenesulfonyloxy)succinimide, N-(2-trifluoromethylbenzenesulfonyloxy)phthalimide, N-(2-trifluoromethylbenzenesulfonyloxy)diphenyl maleimide, N-(2-trifluoromethylbenzenesulfonyloxy) bicyclo[2.2.1]hept-5-ene-2,3-dicarboxyimide, N-(2-trifluoromethylbenzenesulfonyloxy)-7-oxabicyclo[2.2.1]hept-5-ene-2,3-dicarboxyimide, N-(2-trifluoromethylbenzenesulfonyloxy)bicyclo[2.2.1]heptan-5,6-oxy-2,3-dicarboxyimide, N-(2-trifluoromethylbenzenesulfonyloxy)naphthylimide, N-(nonaf luorobutylsulfonyloxy) succinimide, N-(nonaf luorobutylsulfonyloxy)phthalimide, N-(nonaf luorobutylsulfonyloxy) diphenyl maleimide, N-(nonafluorobutylsulfonyloxy)bicyclo[2.2.1]hept-5-ene-2,3-dicarboxyimide, N-(nonafluorobutylsulfonyloxy)-7-oxabicyclo[22.1]hept-5-ene-2,3-dicarboxyimide, N-(nonafluorobutylsulfonyloxy)bicyclo[2.2.1]heptan-5,6-oxy-2,3-dicarboxyimide and N-(nonafluorobutylsulfonyloxy)naphthylimide.

(5) Diazomethane Compound Represented by the Following Formula (6):

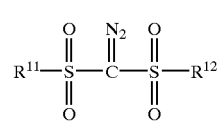

(6)

wherein $R^{11}$ and $R^{12}$ may be the same or different and each a monovalent group such as an alkyl group, aryl group, halogen-substituted alkyl group or halogen-substituted aryl group.

Illustrative examples of the diazomethane compound include bis(trifluoromethylsulfonyl)diazomethane, bis (cyclohexylsulfonyl)diazomethane, bis(phenylsulfonyl) diazomethane, bis(p-toluenesulfonyl)diazomethane, methylsulfonyl-p-toluenesulfonyl diazomethane, 1-cyclohexylsulfonyl-1-(1,1-dimethylethylsulfonyl) diazomethane, bis(1,1-dimethylethylsulfonyl) diazomethane, bis(3,3-dimethyl-1,5-dioxaspiro[5,5] dodecane-8-sulfonyl)diazomethane, bis(1,4-dioxaspiro[4,5] decane-7-sulfonyl)diazomethane and the like.

(6) Disulfonylmethane Compound Pepresented by the Following Formula (7):

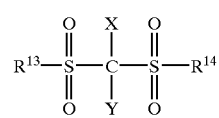

(7)

wherein $R^{13}$ and $R^{14}$ may be the same or different and each a monovalent linear or branched aliphatic hydrocarbon group, cycloalkyl group, aryl group, aralkyl group or monovalent other organic group having a hetero atom, and X and Y may be the same or different and each an aryl group, hydrogen atom, monovalent linear or branched aliphatic hydrocarbon group or monovalent other organic group having a hetero atom, with the proviso that at least one of X and Y is an aryl group and that X and Y are connected to each other to form a monocyclic or polycyclic structure having at least one unsaturated bond or to form a group represented by the following formula (8):

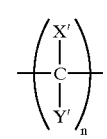

(8)

wherein X' and Y' may be the same or different, X"s may be the same or different, Y"s may be the same or different, and X"s and Y"s are each a hydrogen atom, halogen atom, alkyl group, cycloalkyl group, aryl group or aralkyl group, or X' and Y' bonded to the same carbon atom or different carbon atoms are connected to each other to form a carbon monocyclic structure with the carbon atom(s) that they are bonded to, and n is an integer of 2 to 10.

The above acid generating agents may be used alone or in admixture of two or more.

In the present invention, the amount of the acid generation agent is preferably 0.1 to 20 parts by weight, more preferably 0.5 to 15 parts by weight based on 100 parts by weight of the acid dissociable group-containing resin (A).

Acid Diffusion Control Agent

Preferably, the radiation sensitive resin composition in the present invention further contains an acid diffusion control agent having the function of controlling such a phenomenon that an acid generated from an acid generating agent by exposure is dispersed in a resist film and the function of suppressing an unfavorable chemical reaction in an unexposed area.

By using this acid diffusion control agent, the storage stability of a composition and the resolution of a resist can be improved and changes in the line width of a resist pattern caused by fluctuations in PED can be suppressed, thereby making it possible to obtain very excellent process stability.

The acid diffusion control agent is preferably a nitrogen-containing organic compound whose basicity is not changed by exposure or a heat treatment in the formation process of a resist pattern.

The nitrogen-containing organic compound is a compound sented by the following formula (9):

(9)

wherein $R^{15}$, $R^{16}$ and $R^{17}$ may be the same or different and each a hydrogen atom, alkyl group, aryl group or aralkyl group (whose hydrogen atom may be substituted by a functional group such as a hydroxy group) (to be referred to as "nitrogen-containing compound (I)" hereinafter), diamino compound having two nitrogen atoms in the molecule (to be referred to as "nitrogen-containing compound (II)" hereinafter), diamino polymer having three or more nitrogen atoms (to be referred to as "nitrogen-containing compound (III)" hereinafter), amide group-containing compound, urea compound or nitrogen-containing heterocyclic compound.

Illustrative examples of the nitrogen-containing compound (I) include monoalkylamines such as n-hexylamine, n-heptylamine, n-octylamine, n-nonylamine and n-decylamine; dialkylamines such as di-n-butylamine, di-n-pentylamine, di-n-hexylamine, di-n-heptylamine, di-n-octylamine, di-n-nonylamine and di-n-decylamine; trialkylamines such as triethylamine, tri-n-propylamine, tri-n-butylamine, tri-n-pentylamine, tri-n-hexylamine, tri-n-heptylamine, tri-n-octylamine, tri-n-nonylamine and tri-n-decylamine; aromatic amines such as aniline, N-methylaniline, N,N-dimethylaniline, 2-methylaniline, 3-methylaniline, 4-methylaniline, 4-nitroaniline, diphenylamine, triphenylamine and 1-naphthylamine; and the like.

Illustrative examples of the nitrogen-containing compound (II) include ethylenediamine, N,N,N',N'-tetramethylethylenediamine, N,N,N',N'-tetrakis(2-hydroxyropyl)ethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2'-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene and the like.

Illustrative examples of the nitrogen-containing compound (III) include polymers such as polyethylene-imine, polyallylamine and dimethylaminoethyl acrylamide.

Illustrative examples of the amide group-containing compound include formamide, N-methylformamide, N,N-dimethylformamide, acetamide, N-methylacetamide, N,N-dimethylacetamide, propionamide, benzamide, pyrrolidone, N-methylpyrrolidone and the like.

Illustrative examples of the urea compound include urea, methylurea, 1,1-dimethylurea, 1,3-dimethylurea, 1,1,3,3-tetramethylurea, 1,3-diphenylurea, tributylthiourea and the like.

Illustrative examples of the nitrogen-containing heterocyclic compound include imidazoles such as imidazole, benzimidazole, 4-methylimidazole, 2-phenylbenzimidazole and 4-methyl-2-phenylimidazole; pyridines such as pyridine, 2-methylpyridine, 4-methylpyridine, 2-ethylpyridine, 4-ethylpyridine, 2-phenylpyridine, 4-phenylpyridine, N-methyl-4-phenylpyridine, nicotine, nicotinic acid, nicotinic acid amide, quinoline, 8-oxyquinoline and acridine; pyrazine, pyrazole, pyridazine, quinoxaline, purine, pyrrolidine, piperidine, morpholine, 4-methylmorpholine, piperazine, 1,4-dimethylpiperazine, 1,4-diazabicyclo[2.2.2]octane and the like.

Out of the above nitrogen-containing organic compounds, nitrogen-containing compounds (I) and nitrogen-containing heterocyclic compounds are preferred. Out of the nitrogen-containing compounds (I), trialkylamines are particularly preferred and, out of the nitrogen-containing heterocyclic compounds, pyridines are particularly preferred.

The above acid diffusion control agents may be used alone or in admixture of two or more.

The amount of the acid diffusion control agent is preferably 15 parts or less by weight, more preferably 0.001 to 10 parts by weight, the most preferably 0.005 to 5 parts by weight based on 100 parts by weight of the acid dissociable group-containing resin (A). When the amount of the acid diffusion control agent is larger than 15 parts by weight, the photospeed of a resist can shift to recy slow or the developability of an exposed portion can terribly be spoilt. When the amount is smaller than 0.001 part by weight, the pattern shape and accuracy of a resist can be deteriorated under some practical process conditions.

Other Additives

The radiation sensitive resin composition of the present invention may comprise a surfactant which has the function of improving the coatability and striation of a composition and the developability of a resist.

Illustrative examples of the surfactant include polyoxyethylene lauryl ether, polyoxyethylene stearyl ether, polyoxyethylene oleyl ether, polyoxyethylene octylphenol ether, polyoxyethylene nonylphenol ether, polyethylene glycol dilaurate, polyethylene glycol distearate and the like. Commercial products of the surfactant include F Top EF301, EF303 and EF352 (Tokem Products Co., Ltd.), Megafax F171 and F173 (Dainippon Ink and Chemicals, Inc.), Florade FC430 and FC431 (Sumitomo 3M Limited), Asahi Guard AG710 and Surflon S-382, SC101, SC102, SC103, SC104, SC105 and SC106 (Asahi Glass Co., Ltd.), KP341 (Shin-EtsuChemical Co., Ltd.), Polyflow No. 75 and No. 95 (Kyoeisha Kagaku Co., Ltd.) and the like.

The amount of the surfactant is generally 2 parts or less by weight based on 100 parts by weight of the acid dissociable group-containing resin (A).

The radiation sensitive resin composition of the present invention may further comprise a sensitizer that absorbs radiation energy and transmits the energy to the acid generating agent, which would finally result in an increase in the amount of inducing acid from acid generating agent and lead a shift of the photospeed to the faster side.

Preferred examples of the sensitizer include benzophenones, Rose Bengales, anthracenes and the like.

The amount of the sensitizer is generally 50 parts or less by weight based on 100 parts by weight of the acid dissociable group-containing resn (A).

The latent image of an exposed portion can be visualized and the influence of halation at the time of exposure can be alleviated by blending a dye and/or pigment and adhesion to a substrate can be further improved by blending an adhesive aid.

A halation preventing agent such as 4-hydroxy-4'-methyl chalcone, shape improving agent, storage stabilizer, antifoaming agent as other additives may also be blended.

Solvent

The radiation sensitive resin composition of the present invention is prepared in the form of a solution by uniformly dissolving the composition in a solvent to ensure that the total solids content should become 1 to 50 wt %, preferably 5 to 40 wt % when it is used and filtering the resulting solution with a filter having a pore diameter of about 0.2 µm.

Illustrative examples of the solvent used to prepare the above composition solution include ethylene glycol monoalkyl ether acetates such as ethylene glycol monomethyl ether acetate, ethylene glycol monoethyl ether acetate, ethylene glycol mono-n-propyl ether acetate and ethylene glycol mono-n-butyl ether acetate; propylene glycol monoalkyl ethers such as propylene glycol monomethyl ether, propylene glycol monoethyl ether, propylene glycol mono-n-propylene ether and propylene glycol mono-n-butyl ether; propyl glycol dialkyl ethers such as propylene glycol dimethyl ether, propylene glycol diethyl ether, propylene glycol di-n-propyl ether and propylene glycol di-n-butyl ether; propylene glycol monoalkyl ether acetates such as propylene glycol monomethyl ether acetate, propylene glycol monoethyl ether acetate, propylene glycol mono-n-propyl ether acetate and propylene glycol mono-n-butyl ether acetate; lactates such as methyl lactate, ethyl lactate, n-propyl lactate and i-propyl lactate; aliphatic carboxylates such as n-amyl formate, i-amyl formate, ethyl acetate, n-propyl acetate, i-propyl acetate, n-butyl acetate, i-butyl acetate, n-amyl acetate, i-amyl acetate, i-propyl propionate, n-butyl propionate and i-butyl propionate; other esters such as ethyl hydroxyacetate, ethyl 2-hydroxy-2-methylpropionate, methyl 2-hydroxy-3-methylbutyrate, ethyl methoxyacetate, ethyl ethoxyacetate, methyl 3-methoxypropionate, ethyl 3-methoxypropionate, methyl 3-ethoxypropionate, ethyl 3-ethoxypropionate, 3-methoxybutyl acetate, 3-methyl-3-methoxybutyl acetate, 3-methyl-3-methoxybutyl propionate, 3-methyl-3-methoxybutyl butyrate, methyl acetoacetate, ethyl acetoacetate, methyl pyruvate and ethyl pyruvate; aromatic hydrocarbons such as toluene and xylene; ketones such as methyl ethyl ketone, methyl propyl ketone, methyl butyl ketone, 2-heptanone, 3-heptanone, 4-heptanone and cyclohexanone; amides such as N-methylformamide, N,N-dimethylformamide, N-methylacetamide, N,N-dimethylacetamide and N-methylpyrrolidone; lactones such as γ-butyrolactone; and the like.

These solvents may be used alone or in admixture of two or more.

Formation of Resist Pattern

To form a resist pattern from the radiation sensitive resin composition of the present invention, the composition solution prepared as described above is coated on a substrate such as a silicon wafer or a wafer coated with aluminum by suitable coatingmeans such as rotation coating, cast coating, roll coating or the like to form a resist film which is then prebaked at a temperature of 70 to 160° C. as the case may be and exposed through a predetermined mask pattern. The radiation used herein is suitably selected from far ultraviolet radiation from an ArF excimer laser (wavelength of 193 nm) or KrF excimer laser (wavelength of 248 nm), X-ray radiation such as synchrotron radiation and charged beams such as electron beams according to the type of acid generating agent. Exposure conditions such as the amount of exposure are suitably selected according to the composition of the radiation sensitive resin composition and the types of additives.

To form a highly accurate fine pattern stably in the present invention, postbaking is preferably carried out at a temperature of 70 to 160° C. for 30 seconds or more after exposure. When the temperature of postbaking after exposure is lower than 70° C., differences in sensitivity according to the type of substrate may spread.

Thereafter, the exposed resist film is developed with an aqueous-alkaline developer at a sufficient temperature for a sufficient time, for example, 10 to 50° C. for 30 to 200 seconds, preferably at 15 to 30° C. for 30 to 100 seconds, particularly preferably at 20 to 25° C. for 30 to 90 seconds to form a predetermined resist pattern with a predetermined amount of reduction in film thickness (to be defined hereinafter).

The above aqueous-alkaline developer is, for example, an alkaline aqueous solution prepared by dissolving an alkaline compound such as an alkali metal hydroxide, ammonia water, mono-, di- or tri-alkylamine, mono-, di- or tri-alkanolamine, heterocyclic amine, tetraalkyl ammonium hydroxide, choline, 1,8-diazabicyclo[5.4.0]-7-undecene or 1,5-diazabicyclo[4.3.0]-5-nonene to a concentration of 1 to 10 wt %, preferably 1 to 5 wt %, particularly preferably 1 to 3 wt %.

The developer which is an alkaline aqueous solution may contain a water-soluble organic solvent such as methanol or ethanol, and a surfactant in a suitable amount.

When an alkaline aqueous solution is used as the developer, the film is generally rinsed with water after development.

A technique for making large a difference in solubility in a developer between an unexposed portion and an exposed portion of a resist has been generally employed to improve the resolution of a resist. Therefore, the film thickness of an unexposed portion is generally reduced by less than 100 Å (corresponding to a difference between the film thickness of an unexposed portion before development and the film thickness of the unexposed portion after development, to be referred to as "amount of reduction in film thickness") with the developer.

Unlike the method of the prior art, in the method of the present invention, a resist pattern is formed such that the film thickness of an unexposed portion after development is reduced by 100 to 400 Å, preferably 200 to 400 Å (thinner and smaller) from the film thickness of the unexposed portion before development. Surprisingly, it has been made clear that a resist pattern having very few development defects (for example, 100 or less development defects, preferably 10 or less development defects per wafer (area of about 150 $cm^2$)) is thereby formed.

With a view to controlling the amount of reduction in film thickness to the above range by the method of the present invention, it is important to control the composition of the chemically amplified positive radiation sensitive resin composition used.

The amount of reduction in film thickness changes according to the development temperature, development time, baking temperature after coating and the like. It has been found that as the development temperature becomes higher, the development time becomes longer and the baking temperature after coating becomes lower, the amount of reduction in film thickness increases. Therefore, the method of the present invention should be understood as a method of controlling the composition of the radiation sensitive resin composition in consideration of these factors which influence the amount of reduction in film thickness. For example, when the development temperature and the development time are conditions for reducing the amount of reduction in film thickness, composition which ensures that the amount of reduction in film thickness becomes relatively large should be used to attain a fixed amount of reduction in film thickness. When the baking temperature after coating is low to increase the amount of reduction in film thickness, composition that ensures that the amount of reduction in film thickness becomes relatively small should be used to attain a fixed amount of reduction in film thickness.

The factors which greatly influence the amount of reduction in film thickness in the radiation sensitive resin composition include, for example, the protecting ratio of an acid dissociable group into the resin (A), the type and amount of the radiation sensitive acid generating agent, and the like. It has been revealed that the amount of reduction in film thickness tends to becomes smaller as the protecting ratio of the acid dissociable group rises and that the relationship between changes in the protecting ratio and changes in the amount of reduction in film thickness is almost linear. It has also been found that an onium salt exerts a greater influence upon the amount of reduction in film thickness than other radiation sensitive acid generating agents and that the amount of reduction in film thickness can be reduced by increasing the amount of an acid generating agent.

According to the present invention, the amount of reduction in film thickness is controlled to a range of 100 to 400 Å, preferably 200 to 400 Å by changing the composition of the radiation sensitive resin composition in consideration of these factors which influence the above amount of reduction in film thickness.

According to the present invention, there can be provided a resist having very few development defects without impairing resolution even when the amount of reduction in film thickness is 100 Å or more. When the amount of reduction in film thickness is smaller than 100 Å, there is a tendency that the effect of suppressing development defects cannot be seen and when the amount of reduction in film thickness is more than 400 Å, the effect of suppressing development defects is seen but the resolution of a resist deteriorates.

To prevent the influence of basic impurities and the like contained in an environmental atmosphere upon the formation of a resist pattern, a protective film may be formed on the resist film.

The following examples are provided for the purpose of further illustrating the present invention but are in no way to be taken as limiting.

EXAMPLES

Examples 1 to 11 and Comparative Examples 1 and 2

Components shown in Table 1 (parts are based on weight) were mixed together to prepare a uniform solution which was then filtered with a Teflon membrane filter having a pore diameter of 0.2 μm to prepare a composition solution.

The composition solution was rotation coated on a silicon water and prebaked at a temperature for a time shown in Table 2 to form a resist film having a thickness of 0.7 μm. This resist film was exposed to KrF excimer laser beams (wavelength of 248 nm) through a mask pattern using the KrF excimer laser of Nikon K.K. (trade name: NSR-2205 EX8A) by changing the amount of exposure. In some of the above Examples, the resist film was exposed to electron beams through a mask pattern using a simple electron beam direct illuminator (50 KeV) in place of KrF excimer laser by changing the amount of exposure. After exposure, the resist film was postbaked at a temperature for a time shown in Table 2. Thereafter, the resist film was developed using a tetramethyl ammonium hydroxide aqueous solution having a concentration shown in Table 2 at a temperature for a time shown in Table 2, rinsed with water for 30 seconds and dried to form a resist pattern.

The evaluation results of Examples and Comparative Examples are shown in Table 3. The measurements of Mw and Mw/Mn and the evaluation of each resist were carried out as follows.

Mw and Mw/Mn

GPC columns ($2 \times G2000H_{XL} + 1 \times G3000H_{XL} + 1 \times G4000H_{XL}$) manufactured by Toso Co., Ltd. are used to measure Mw and Mn by GPC using monodisperse polystyrene as the standard under the following analytical conditions.

flow rate: 1.0 ml/minute eluting solvent: tetrahydrofuran column temperature: 40° C.

Sensitivity

The amount of exposure for forming a line-and-space pattern (1L1S) having a design line width of 0.26 μm to a line/space width ratio of 1:1 is taken as the optimum amount of exposure and sensitivity is evaluated based on this optimum amount of exposure.

Resolution

The minimum size (μm) of a resist pattern (1L1S) which is exposed to the optimum amount of light and resolved when a line-and-space pattern (1L1S) having a design line width of 0.26 μm is formed is taken as resolution.

Amount of Reduction in Film Thickness

The difference between the film thickness of an unexposed portion after coating and prebaking and the film thickness of the unexposed portion after development in a tetraalkylammonium hydroxide aqueous solution as a developer having a concentration shown in Table 2 is taken as the amount of reduction in film thickness.

Development Defects

Development defects are evaluated by a method for observing the existence of development defects through an optical microscope and the following method using the KLA defect inspection device of KLA Tencole Co., Ltd.

Method using KLA defect inspection device:

The total number of clustered and unclustered defects extracted from differences produced by superimposing a comparison image on pixel units by observing in an array mode. The detection of the total number of defects is carried out by setting the sensitivity of this device to such a level that 0.15 μm or larger defects can be detected.

For evaluation, the total number of defects per wafer (area of about 150 cm$^2$) is counted in the method using the above KLA defect inspection device.

PED Stability

A sample which is exposed to the optimum amount of light when it is postbaked right after exposure and developed is placed in a chamber in which the concentration of ammonia in the atmosphere is controlled to 5 ppb for 2 hours, postbaked and developed to form a line-and-space pattern (1L1S) having a design line width of 0.26 μm. The line width (Ltop) on the top of the pattern is measured by a scanning electron microscope and evaluated based on the following criteria.

0.26×0.85<Ltop<0.26×1.1: satisfactory 0.26×0.85≧Ltop: thin 0.26×1.1≦Ltop: thick

Components used in Examples and Comparative Examples are as follows.

Acid Dissociable Group-containing Resin (A)

A-1-1: resin prepared by substituting 30 mol % of hydrogen atoms in phenolic hydroxyl groups contained in poly(4-hydroxystyrene) obtained by hydrolyzing the t-butyl groups of poly(4-t-butoxy)styrene synthesized by radical polymerization by a 1-ethoxyethyl group (Mw=18,000, Mw/Mn=1.5).

A-1-2: resin prepared by substituting 40 mol % of hydrogen atoms in phenolic hydroxyl groups contained in poly(4-hydroxystyrene) obtained by hydrolyzing the t-butyl groups of poly(4-t-butoxy)styrene synthesized by radical polymerizdtion by a 1-ethoxyethyl group (Mw=18,000, Mw/Mn=1.5).

A-1-3: resin prepared by substituting 30 mol % of hydrogen atoms in phenolic hydroxyl groups contained in poly(4-hydroxystyrene) obtained by party hydrolyzing the t-butyl groups of poly(4-t-butoxy)styrene synthesized by anion polymerization by a 1-ethoxyethyl group (Mw=15,000, Mw/Mn=1.1).

A-1-4: resin prepared by substituting 20 mol % of hydrogen atoms in phenolic hydroxyl groups contained in poly(4-hydroxystyrene) obtained by partly hydrolyzing the t-butyl groups of poly(4-t-butoxy)styrene synthesized by anion polymerization by a 1-ethoxyethyl group and 10 mol % of the hydrogen atoms by a t-butyl group (Mw=15,000,).

A-2-1: resin prepared by substituting 25 mol % of hydrogen atoms in phenolic hydroxyl groups contained in poly(4-hydroxystyrene) obtained by hydrolyzing the t-butyl groups of poly(4-t-butoxy)styrene synthesized by radical polymerization by a t-butoxycarbonyl group (Mw=8,000, Mw/Mn=1.5).

A-3-1: resin prepared by substituting 30 mol % of hydrogen atoms in phenolic hydroxyl groups contained in poly(4-hydroxystyrene) obtained by partly hydrolyzing the t-butyl groups of poly(4-t-butoxy)styrene synthesized by anion polymerization by a t-butyl group (Mw=15,000, Mw/Mn=1.05).

A-3-2: resin prepared by substituting 30 mol % of hydrogen atoms in phenolic hydroxyl groups contained in poly(4-hydroxystyrene) obtained by partly hydrolyzing the t-butyl groups of poly(4-t-butoxy)styrene synthesized by radical polymerization by a t-butyl group (Mw=12,000, Mw/Mn=1.5).

A-3-3: radical copolymer of 4-hydroxystyrene/styrene/p-t-butoxystyrene (molar ratio=70/10/20, Mw=12,500).

A-4-1: copolymer of 4-hydroxystyrene/styrene/t-butyl acrylate (molar ratio=70/20/10, Mw=12,000).

A-4-2: copolymer of 4-hydroxystyrene/styrene/t-butyl acrylate (molar ratio=60/20/20, Mw=12,000).

A-4-3: copolymer of 4-hydroxystyrene/4-t-butoxystyrene/t-butyl acrylate (molar ratio=75/20/5, Mw=12,000).

A-4-4: resin prepared by partly hydrolyzing t-butyl groups in a copolymer of 4-t-butoxystyrene/t-butyl acrylate (molar ratio=90:10) to convert 80% of the t-butyl groups into phenolic hydroxyl groups (Mw=12,000).

A-5-1: copolymer of 4-hydroxystyrene/t-butyl acrylate/2,5-dimethyl-2,5-hexanediol diacrylate (molar ratio=75/20/5, Mw=40,000).

A-5-2: copolymer of 4-hydroxystyrene/styrene/t-butyl acrylate/2,5-dimethyl-2,5-hexanediol diacrylate (molar ratio=75/10/10/5, Mw=30,000).

A-5-3: copolymer of 4-hydroxystyrene/styrene/t-butyl acrylate/2,5-dimethyl-2,5-hexanediol diacrylate (molar ratio=65/10/20/5, Mw=30,000).

Acid Generating Agent (B)

B-1: 1,1-bis(cyclohexylsulfonyl)diazomethane

B-2: bis(3,3-dimethyl-1,5-dioxaspiro[5,5]dodecane-8-sulfonyl)diazomethane

B-3: bis(1,4-dioxaspiro[4,5]decane-7-sulfonyl)diazomethane

B-4: triphenylsulfonium trifluoromethane sulfonate

B-5: tri(4-methoxyphenyl)sulfonium trifluoromethane sulfonate

B-6: bis(4-t-butylphenyl)iodonium 10-camphor sulfonate

B-7: bis(4-t-butylphenyl)iodonium trifluoromethane sulfonate

B-8: bis(4-t-butylphenyl)iodonium nonafluoro-n-butane sulfonate

Acid Diffusion Control Agent (C)

C-1: N,N,N',N'-tetrakis(2-hydroxypropyl)ethylene diamine

C-2: trioctylamine

C-3: triethanolamine

C-4: 2-phenylbenzimidazole

Solvent

D-1: ethyl lactate

D-2: propylene glycol monomethyl ether acetate

D-3: 2-heptanone

D-4: ethyl-3-ethoxypropionate

TABLE 1

| | acid dissociable group-containing resin (A) (parts) | acid generating agent (B) (parts) | acid diffusion control agent (C) (parts) | Solvent (D) |
|---|---|---|---|---|
| Ex. 1 | A-1-1(70) | B-1(5) | C-2(0.1) | D-1(150) |
| | A-3-2(30) | B-4(1) | C-3(0.05) | D-2(350) |
| Ex. 2 | A-1-3(70) | B-2(5) | C-3(0.1) | D-1(150) |
| | A-3-1(30) | B-4(1) | C-4(0.05) | D-2(350) |
| Ex. 3 | A-1-4(100) | B-3(5) | C-2(0.1) | D-1(150) |
| | | B-4(1) | C-3(0.03) | D-2(350) |
| Ex. 4 | A-3-2(100) | B-6(3) | C-1(0.2) | D-3(500) |
| | | B-8(2) | | |
| Ex. 5 | A-3-3(100) | B-6(4) | C-1(0.15) | D-1(350) |
| | | | C-4(0.05) | D-4(150) |

TABLE 1-continued

|  | acid dissociable group-containing resin (A) (parts) | acid generating agent (B) (parts) | acid diffusion control agent (C) (parts) | Solvent (D) |
|---|---|---|---|---|
| Ex. 6 | A-4-1(75)<br>A-4-2(25) | B-6(3)<br>B-7(2) | C-1(0.2) | D-1(350)<br>D-4(150) |
| Ex. 7 | A-4-3(100) | B-6(2)<br>B-7(2) | C-1(0.2) | D-1(350)<br>D-2(150) |
| Ex. 8 | A-4-4(100) | B-6(2)<br>B-8(2) | C-1(0.2) | D-1(350)<br>D-2(150) |
| Ex. 9 | A-5-1(20)<br>A-5-2(80) | B-6(3)<br>B-7(2) | C-1(0.1) | D-1(350)<br>D-4(150) |
| Ex. 10 | A-5-2(100) | B-6(3)<br>B-8(1.5) | C-1(0.1) | D-1(350)<br>D-2(150) |
| Ex. 11 | A-5-2(75)<br>A-5-3(25) | B-6(3)<br>B-8(1.5) | C-1(0.1) | D-1(350)<br>D-2(150) |
| C. Ex. 1 | A-1-2(80)<br>A-3-2(20) | B-2(5)<br>B-5(1) | C-2(0.1)<br>C-3(0.05) | D-1(150)<br>D-2(350) |
| C. Ex. 2 | A-2-1(100) | B-4(2) | C-2(0.2) | D-1(350)<br>D-2(150) |

Ex.: Example
C. Ex.: Comparative Example

TABLE 2

|  | PB | | development conditions | | | | PEB | |
|---|---|---|---|---|---|---|---|---|
|  | temperature (° C.) | time (sec) | concentration (wt %) | time (sec) | temperature (° C.) | light source for exposure | temperature (° C.) | time (sec) |
| Ex. 1 | 100 | 90 | 2.38 | 60 | 23 | KrF excimer laser(*1) | 110 | 90 |
| Ex. 2 | 100 | 90 | 2.38 | 60 | 23 | same as above | 110 | 90 |
| Ex. 3 | 100 | 90 | 1.19 | 30 | 23 | same as above | 110 | 60 |
| Ex. 4 | 130 | 60 | 2.38 | 60 | 23 | same as above | 130 | 90 |
| Ex. 5 | 140 | 90 | 2.38 | 60 | 23 | same as above | 140 | 90 |
| Ex. 6 | 140 | 90 | 2.38 | 60 | 23 | same as above | 140 | 90 |
| Ex. 7 | 130 | 90 | 2.38 | 60 | 23 | same as above | 150 | 90 |
| Ex. 8 | 140 | 90 | 2.38 | 60 | 23 | Electron beams(*2) | 140 | 90 |
| Ex. 9 | 130 | 90 | 2.38 | 60 | 23 | KrF excimer laser(*1) | 130 | 90 |
| Ex. 10 | 130 | 90 | 2.38 | 60 | 20 | same as above | 130 | 90 |
| Ex. 11 | 130 | 90 | 2.38 | 45 | 23 | same as above | 130 | 90 |
| C. Ex. 1 | 100 | 90 | 2.38 | 60 | 23 | KrF excimer laser(*1) | 110 | 90 |
| C. Ex. 2 | 90 | 90 | 2.38 | 60 | 23 | same as above | 110 | 90 |

(*1)using the NSR-2205EX8A KrF excimer stepper of Nikon K. K. (NA = 0.5)
(*2)using a simple electron beam direct illuminator (acceleration voltage of 50 KeV)

TABLE 3

|  | sensitivity | resolution ($\mu$m) | amount of reduction in film thickness (Å) | number of development defects (/per wafer) | PED stability |
|---|---|---|---|---|---|
| Ex. 1 | 32 mJ/cm$^2$ | 0.2 | 201 | 2 | good |
| Ex. 2 | 29 mJ/cm$^2$ | 0.22 | 226 | 6 | good |
| Ex. 3 | 33 mJ/cm$^2$ | 0.22 | 212 | 4 | good |
| Ex. 4 | 36 mJ/cm$^2$ | 0.2 | 120 | 53 | good |
| Ex. 5 | 32 mJ/cm$^2$ | 0.2 | 225 | 4 | good |
| Ex. 6 | 42 mJ/cm$^2$ | 0.2 | 122 | 28 | good |
| Ex. 7 | 33 mJ/cm$^2$ | 0.2 | 161 | 49 | good |
| Ex. 8 | 8 $\mu$C/cm$^2$ | 0.22 | 243 | 0 | good |
| Ex. 9 | 23 mJ/cm$^2$ | 0.22 | 283 | 0 | good |
| Ex. 10 | 27 mJ/cm$^2$ | 0.2 | 201 | 2 | good |
| Ex. 11 | 28 mJ/cm$^2$ | 0.2 | 206 | 0 | good |
| C. Ex. 1 | 33 mJ/cm$^2$ | 0.23 | 20 | 1023 | thin |
| C. Ex. 2 | 23 mJ/cm$^2$ | 0.24 | 22 | 573 | thick |

According to the present invention, there can be obtained a resist pattern which is not changed in line width or T-shaped by PED, is free from development defects, provides a high yield in the production of devices, and has high sensitivity for various types of radiation such as far ultraviolet radiation, charged beams and X-ray radiation (small amount of exposure energy) and excellent resolution.

What is claimed is:

1. A method of forming a resist pattern from a chemically amplified positive radiation sensitive resin composition, comprising:

coating a solution of the resin composition onto a substrate, thereby forming a resist film, said resin composition comprising a resin consisting essentially of repeat units represented by formula 1 and at least one monomer selected from the group consisting of styrene, α-methylstyrene and p-methylstyrene;

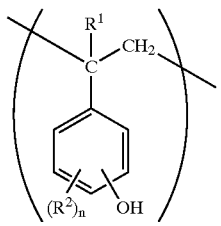

(1)

exposing the resist film through a predetermined mask pattern, thereby forming an exposed portion and an unexposed portion of the resist film; and developing the exposed resist film with an aqueous-alkaline developer to form a predetermined resist pattern, wherein the thickness of the unexposed portion of the resist film after said developing is 100 to 400 Å less than the thickness of the unexposed portion of the resist film before said developing, the developed resist film has a resolution of no more than 0.22 μm, $R^1$ is a hydrogen atom or methyl group, $R^2$ is a halogen atom or monovalent organic group having 1 to 6 carbon atoms, n is an integer of 0 to 3, and at least one of the hydrogen atoms of the hydroxyl group of the repeat unit of formula 1 are substituted by an acid dissociable group selected from the group consisting of t-butyl, 1-methoxymethyl, 1-methoxyethyl, 1-ethoxyethyl, 1-cyclohexyloxyethyl, 1-ethoxypropyl, 1-propoxyethyl, trimethylsilyl, t-butoxycarbonyl, t-butoxycarbonylmethyl, tetrahydropyranyl, tetrahydrofuranyl, and combinations thereof.

2. The method of claim 1, wherein the resin composition further comprises a radiation sensitive acid generating agent capable of decomposing the acid dissociable group in the exposed portions of the resist film, and the solubility of the exposed portion of the resist film in an aqueous-alkaline developer increases with the amount of decomposition of the acid dissociable group.

3. The method of claim 2, wherein the ratio of the number of moles of the acid dissociable group to the total of the number of moles of the hydroxyl group and acid dissociable group in the resin composition is 0.15 to 0.90.

4. The method of claim 1, wherein the resist pattern after said developing has ≦100 development defects per 150 cm² of the resist pattern.

5. The method of claim 1, further comprising baking the resist film after said exposing, and prior to said developing.

6. The method of claim 1, wherein the film thickness of an unexposed portion of the resist film after said developing is 200 to 400 Å less than the thickness of the unexposed portion of the resist film before said developing.

7. The method of claim 1, wherein said developing is carried out at a temperature and for a time whereby the film thickness of the unexposed portion of the exposed resist film after said developing is 100 to 400 Å less than the thickness of the unexposed portion of the resist film before said developing.

8. The method of claim 7, wherein the resin composition further comprises a radiation sensitive acid generating agent capable of decomposing the acid dissociable group in the exposed portions of the resist film, and the solubility of the exposed portion of the resist film in an aqueous-alkaline developer increases with the amount of decomposition of the acid dissociable group.

9. The method of claim 8, wherein the ratio of the number of moles of the acid dissociable group to the total of the number of moles of the hydroxyl group and acid dissociable group in the resin composition is 0.15 to 0.90.

10. The method of claim 7, wherein the resist pattern has ≦100 development defects per 150 cm² of the resist pattern.

11. The method of claim 7, wherein said developing is carried out at a temperature of from 10–50° C. and a time of 30–200 seconds.

12. The method of claim 7, wherein said exposing is to far ultraviolet radiation, electron beam, x-ray radiation, and synchrotron radiation.

13. The method of claim 7, wherein said aqueous-alkaline developer is an aqueous solution of at least one compound selected from the group consisting of an alkali metal hydroxide, ammonia, mono-alkylamine, di-alkylamine, tri-alkylamine, mono-alkanolamine, di-alkanolamine, tri-alkanolamine, heterocyclic amine, tetraalkylammonium hydroxide, choline, 1,8-diazabicyclo[5.4.0]-7-undecene, and 1,5-diazabicyclo[4.3.0]-5-nonene.

14. The method of claim 13, wherein the amount of said compound in said aqueous solution is 1–10 wt %.

15. The method of claim 1, wherein said exposing is exposing to far ultraviolet radiation, electron beam, x-ray radiation, and synchrotron radiation.

16. The method of claim 1, wherein said aqueous-alkaline developer is an aqueous solution of at least one compound selected from the group consisting of an alkali metal hydroxide, ammonia, mono-alkylamine, di-alkylamine, tri-alkylamine, mono-alkanolamine, di-alkanolamine, tri-alkanolamine, heterocyclic amine, tetraalkylammonium hydroxide, choline, 1,8-diazabicyclo[5.4.0]-7-undecene, and 1,5-diazabicyclo[4.3.0]-5-nonene.

17. The method of claim 16, wherein the amount of said compound in said aqueous solution is 1–10 wt %.

* * * * *